(12) United States Patent
Nellissen

(10) Patent No.: US 7,659,038 B2
(45) Date of Patent: Feb. 9, 2010

(54) LITHOGRAPHIC METHOD FOR WIRING A SIDE SURFACE OF A SUBSTRATE

(75) Inventor: Antonius Johannes Maria Nellissen, Eindhoven (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 705 days.

(21) Appl. No.: 10/528,946

(22) PCT Filed: Sep. 26, 2003

(86) PCT No.: PCT/IB03/04285

§ 371 (c)(1),
(2), (4) Date: Mar. 23, 2005

(87) PCT Pub. No.: WO2004/029722

PCT Pub. Date: Apr. 8, 2004

(65) Prior Publication Data

US 2006/0051679 A1    Mar. 9, 2006

(30) Foreign Application Priority Data

Sep. 27, 2002    (EP) .................................. 02079067

(51) Int. Cl.
 *G03F 1/00* (2006.01)
(52) U.S. Cl. ........................................................ 430/5
(58) Field of Classification Search .................. 430/5, 430/311; 250/492.2, 492.22
See application file for complete search history.

(56) References Cited

U.S. PATENT DOCUMENTS

| 5,818,988 | A | 10/1998 | Modavis |
| 5,942,375 | A | 8/1999 | Gosima |
| 6,183,918 | B1* | 2/2001 | Nishiki ........................ 430/22 |
| 6,188,519 | B1 | 2/2001 | Johnson |
| 6,240,621 | B1 | 6/2001 | Nellissen et al. |
| 6,262,791 | B1 | 7/2001 | Powell |
| 6,352,800 | B1* | 3/2002 | Suganaga ...................... 430/5 |
| 6,420,755 | B1 | 7/2002 | Bloos et al. |

FOREIGN PATENT DOCUMENTS

| EP | 0602829 A1 | 6/1994 |
| EP | 1128211 A1 | 8/2001 |
| JP | 11212246 A | 8/1999 |

OTHER PUBLICATIONS

Ton Nellissen, et al: A Novel Photolithographic Method for Realizing 3-D Interconnection Patterns on Electronic Modules, pp. 1-6.

* cited by examiner

*Primary Examiner*—Stephen Rosasco

(57) ABSTRACT

In a lithographic proximity method for wiring an end or internal side surface of a substrate, the required exposure of strips, defining the wiring pattern, is performed by a mask having a diffraction structure to deflect exposure radiation to the side surface. An exposure beam, which is perpendicularly incident on the mask, is used so that enhanced tolerance for proximity gap width variations is obtained. The method allows manufacture of accurate and fine wiring.

20 Claims, 10 Drawing Sheets

Prior Art

Prior Art

LITHOGRAPHIC METHOD FOR WIRING A SIDE SURFACE OF A SUBSTRATE

The invention relates to a lithographic method of providing at least one side surface of a substrate with electrical wiring comprising at least one electrically conducting strip, which method comprises the steps of:
provide a substrate comprising at least one side surface;
coating the at least one side surface with a resist layer;
providing a mask comprising a mask pattern having a number of exposure radiation passing areas corresponding to the number of side surfaces to be wired;
providing a proximity printing apparatus comprising a source of exposure radiation, a mask holder and a substrate holder;
arranging the substrate in the substrate holder and the mask in the mask holder, such that the radiation passing areas of the mask pattern face the substrate side surfaces to be wired; exposing the said surfaces via the radiation passing area;
selectively removing resist material from the resist layer thereby forming a resist pattern, and
using the resist pattern as a mask for configuring conductive material to obtain the required wiring.

A side surface of a substrate is understood to mean an end surface of a substrate not being a main, upper or lower surface as well as a wall of an opening in the substrate. Such an opening may be a round hole or a rectangular or otherwise shaped groove, or slot. The opening may extend over the entire thickness of the substrate or may have a depth equal to a fraction of this thickness.

Wiring a surface is understood to mean providing the surface with one up to a large number of strip(s) or wire(s), which strips are distinguished from the rest of the surface by different electrical conductivity. Configuring conductive material is understood to mean both etching of a conductive layer under the resist layer, which is called a subtractive process, and growing a conductive material in open areas of the resist layer, which is called an additive process.

U.S. Pat. No. 6,240,621 describes a lithographic method for the simultaneous manufacture of a plurality of thin-film, surface mountable, electronic components. According to the known method first a substantially planar ceramic substrate having a first and a second major surface which are mutually parallel and contain a series of mutually parallel slots is provided. These slots extend from the first major surface through to the second major surface and serve to divide the substrate into elongated segments extending parallel to the slots and located between consecutive pairs thereof. Each of these segments carries a thin-film electrode structure on at least one of its first and second major surfaces. By means of a three-dimensional photolithographic technique electrical contacts which extend along both walls of each segment and make electrical contact with the electrode structure on each segment are provided. Then the segments are severed into individual block-shaped elements by severing them along a series of dividing lines extending substantially perpendicularly to the walls of each segment. This method can be used to manufacture various types of components, such as thin-film transistors, fuses, capacitors and inductors, but also passive networks, such as RC and LCR networks.

The electrical contacts, or electrically conducting tracks, are obtained by coating the segment walls by successively an electrically conducting layer and a radiation-sensitive, or resist-, layer. The substrate provided with these layers is exposed by means of a collimated exposure beam via a mask comprising radiation transparent areas at positions corresponding to the positions of the slots. Then the exposed portions of the resist are removed and the remaining resist pattern is used as mask to etch the conducting layer so that the required interconnection pattern is obtained. To expose the wall resist layers across their full depth, the exposure beam is a skew beam, i.e. the chief ray of this beam makes a sharp angle to the normal of the substrate plane. To improve the exposure a reflector is arranged at the substrate surface remote from the exposure source, which reflector is used to re-direct exposure radiation to the segment walls. Alternatively, two exposure sources, each supplying a skew exposure beam, can be used to expose the substrates from opposite sides.

A disadvantageous effect of skew exposure is that the exposure pattern formed in the upper surface plane of the substrate shifts if a variation in the proximity gap width occurs. The proximity gap is understood to mean the space between the mask and the upper surface of the substrate. If the width of this gap changes, the exposure beam portions intended to expose the slots will fall at least partly outside the slots and, in addition thereto, top surface portion of the substrate will be illuminated. Moreover, if features have to be configured in the first major surface of the substrate and the same exposure beam is used to expose a resist layer on this surface, a skew exposure beam will introduce a shift of the image of the mask pattern used for configuring these features. Skew exposure of said mask pattern also causes variations in the width of printed features, i.e. features of the resist mask used for etching.

It is an object of the invention to solve the above-mentioned problems and to provide a method, which is very accurate and has enlarged capabilities. This method is characterized in that use is made of an exposure beam, which is substantially perpendicular to the mask pattern and of a mask pattern wherein each exposure radiation passing area comprises a diffraction structure to diffract exposure radiation to the relevant substrate surface.

As the exposure beam is perpendicular to the mask pattern, variation in the proximity gap width no longer results in a shift of the exposure pattern. All exposure radiation that is incident on a radiation passage area is directed to the side surfaces of a slot and at the appropriate angle so that the side surfaces are exposed over the required depth. Special means for forming skew exposure beam and two exposure sources or a reflector are no longer needed. Skew radiation is formed only at positions where such radiation is required. As the exposure beam is a collimated beam, this beam can be used for imaging of device mask patterns simultaneously with exposure of said walls.

It is noted that U.S. Pat. No. 5,942,375 discloses a method of fabricating a printed wiring board comprising electrically conducting vias. This method uses a mask with a special type of scattering elements to expose a resist layer on the inner wall of the holes. As such elements scatter the exposure radiation in all directions and thus expose the whole resist surface in the holes, this method is not suitable to form relatively small electrically conducting tracks in the holes.

A first embodiment of the method is characterized in that use is made of a mask pattern wherein the diffraction structure is an amplitude structure.

An amplitude grating structure is understood to mean a structure of alternating transparent and non-transparent strips forming the grating strips and intermediate strips. Such a grating structure, i.e. a black-and-white structure, introduces an amplitude difference between exposure beam portions incident on the grating strips and exposure beam portions incident on the intermediate strips, respectively.

A preferred embodiment of the method is characterized in that use is made of mask pattern wherein the diffraction structure is a phase structure.

A phase grating structure is understood to mean an all-transparent structure wherein the grating strips have a phase depth different from that of the intermediate strips. The phase depth of a grating is understood to mean the phase difference between exposure beam transmitted by the grating strips and exposure beam portions transmitted by the intermediate strips, respectively. To create the phase difference, the grating strips may be located at a level different from that of the intermediate strips or they may have a refraction coefficient that is different from that of the intermediate strips. As a phase grating is fully transparent, it allows concentrating a larger portion of the incident radiation on required positions than an amplitude grating can do.

Preferably the latter method is characterized in that use is made of a mask pattern wherein the phase structure has a duty cycle of 50% and a phase depth of 180°.

The duty cycle of a phase grating is understood to mean the ratio of the width of the grating strips to the grating pitch, i.e. the total width of a grating strip and an intermediate strip. A phase grating having a duty cycle of 50% and a phase depth of 180° allows suppressing the zero order, i.e. straightforward, radiation, which does not contribute to side wall exposure, and concentrating transmitted radiation in the plus and minus first-order beams, which expose the side walls.

More preferably the method is characterized in that use is made of a mask pattern wherein the diffraction structure is designed to deflect incident exposure radiation at an angle of substantially 20° to the normal to the plane of the diffraction structure.

The grating pitch and the wavelength of the radiation determine the angle at which radiation is deflected by a grating. For a chosen wavelength, the deflection angle of 20°, which will be used commonly, can be obtained by choosing the appropriate grating pitch.

The method may be further characterized in that use is made of a mask pattern which comprises, next to a diffraction structure, mask features corresponding to substrate features to be configured in a substrate upper surface layer.

The use of such a mask pattern allows configuring, simultaneously with the electrical wiring on the side surface, features on the top surface of the substrate. These features may constitute an electrical wiring, which joins the wiring on the side surface and leads to a device, for example an electronic component, which is configured in the substrate. The features may also form part of such a component, for example be windings of an inductor coil or capacitor electrodes of a passive network The invention also relates to a mask having a mask pattern especially designed for the novel method. Such a mask is characterized in that it shows one or more of the mask features as described hereinabove.

A first embodiment of such a mask is characterized in that the diffraction structure is a linear grating.

By means of such a diffraction grating in the mask pattern an end side surface or two opposite end surfaces of a substrate can be wired.

A second embodiment of the mask is characterized in that the diffraction structure is a two-dimensional grating structure.

By means of a mask pattern with such a diffraction structure two end side surfaces at a mutual angle of 90° or two pairs of opposite side surfaces of a substrate can be wired simultaneously.

A third embodiment of the mask is characterized in that the diffraction structure comprises a number of linear diffraction gratings, which each form a segment of a common circular area As a device manufactured by means of the method is unique with respect to the quality and the width of the conducting strips, such a device forms part of the invention. Moreover the invention allows manufacturing of devices with side surface wiring, which could hitherto not be manufactured.

These and other aspects of the invention are apparent from and will be elucidated, by way of non-limitative example, with reference to the embodiments described hereinafter.

In the drawings:

FIG. 1 schematically shows a proximity printing apparatus by means of which the invention can be carried out;

FIG. 10b shows the induction coil manufactured by means of the diffraction structure of FIG. 10a;

Figure 1:
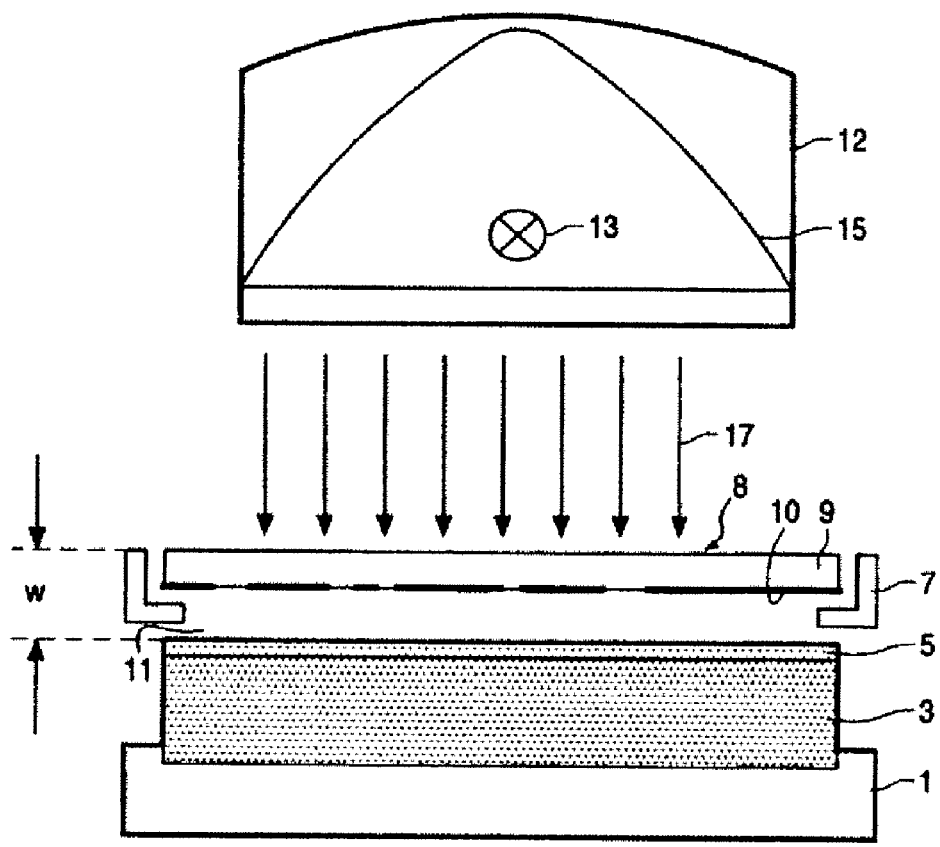

FIG. 1 shows, very schematically, a conventional proximity printing apparatus, which is currently used for the manufacture of, for example an LCD device. The apparatus comprises a substrate holder 1 for carrying a substrate 3 on which the device is to be configured. The substrate is coated with a radiation-sensitive, or resist-, layer 5 in which an image, having features corresponding to the device features, is to be formed. The image information is contained in a mask 8 arranged in a mask holder. The mask comprises a transparent substrate 9, the lower surface of which is provided with a pattern (the mask pattern) 10 of transparent and non-transparent strips and areas, which represent the image information. A small air gap 11, having a gap width W of the order of 100 μm separates the mask pattern 10 from the resist layer 5. The apparatus further comprises an exposure radiation source 12. This source may comprise a lamp 13, for example a mercury arc lamp, and a reflector 15. This reflector reflects lamp radiation, which is emitted in backward and sideways directions to the mask. The reflector may be a parabolic reflector and the lamp may be positioned in a focal point of the reflector so that the exposure beam from the source is substantially a collimated beam. Other or additional optical elements, like one or more lenses, may be arranged in the radiation source to ensure that beam 17 is substantially collimated. This beam is rather broad and exposes the whole mask pattern 10, which may have dimensions from 7.5×7.5 cm² to 40×40 cm². The time needed to image the mask pattern in the resist layer is, for example, 10 sec, inclusive of the time needed to align the substrate with respect to the mask pattern. The means for aligning are not shown in FIG. 1, but these means are well known in the art. After the mask pattern has been imaged in the resist layer, this layer is developed and resist material is stripped from the layer so that a structure of remaining resist areas and non-resist areas is obtained. This structure is used as a mask for etching the underlying substrate layer so that the required device features are configured in this substrate layer. In case of a positive resist the exposed resist areas are stripped off and in case of a negative resist the non-exposed resist areas are stripped off. Between the exposure step and the developing step a post-exposure-bake (PEB) step may be carried out.

A proximity printing apparatus such as shown in FIG. 1 can be used to provide a larger device at several positions with electrical conductors (conducting strips) connecting different layers thereof, or to provide simultaneously a number of small devices (components) with such conducting tracks on their side walls.

Figure 2:
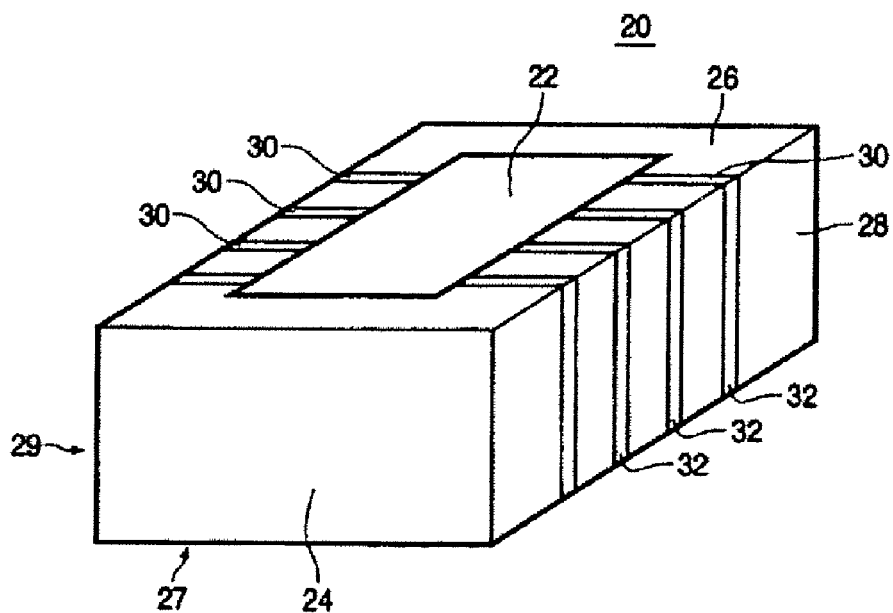
FIG. 2 shows a component, which is provided with a pattern of conducting strips by means of the method according to the invention.

FIG. 2 shows, very schematically, an embodiment of such a component 20, comprising a component structure 22 embedded in a substrate 24. The material of the substrate may be of different types, depending on the type of component, for example, silicon or a ceramic material. To connect the component structure 22 in the upper surface 26 of the component to a component structure (not shown) in the lower component surface 27, the upper and lower surfaces are provided with wiring comprising one or several conducting wires or conducting strips 30. The side surface walls 28, 29 of the component are provided with a corresponding number of conducting wires 32, which connect the corresponding wires on the upper and lower surface.

Figure 3:
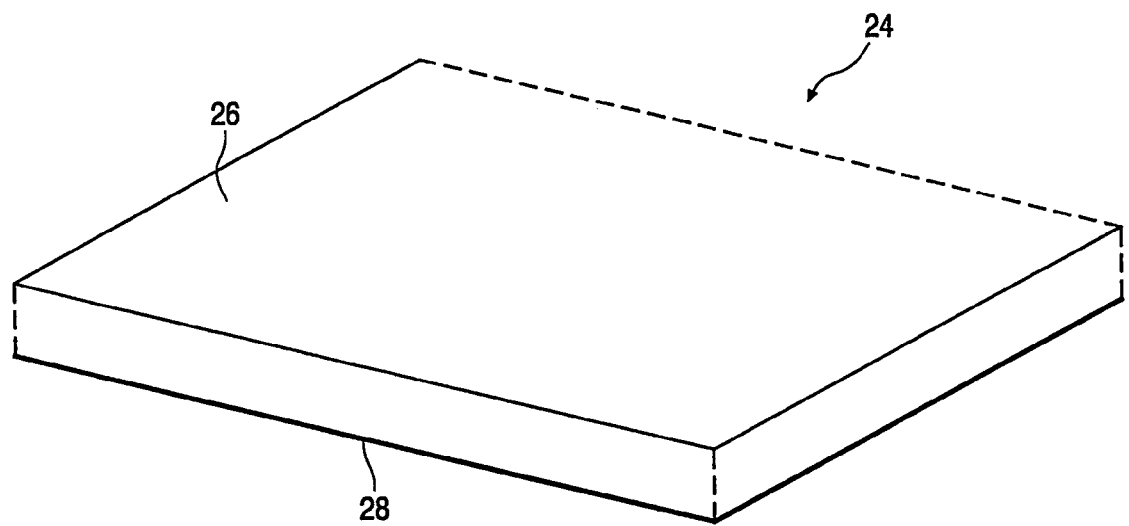
FIG. 3 shows a substrate that is to be provided with slots and conductive strips therein.
Figure 4:
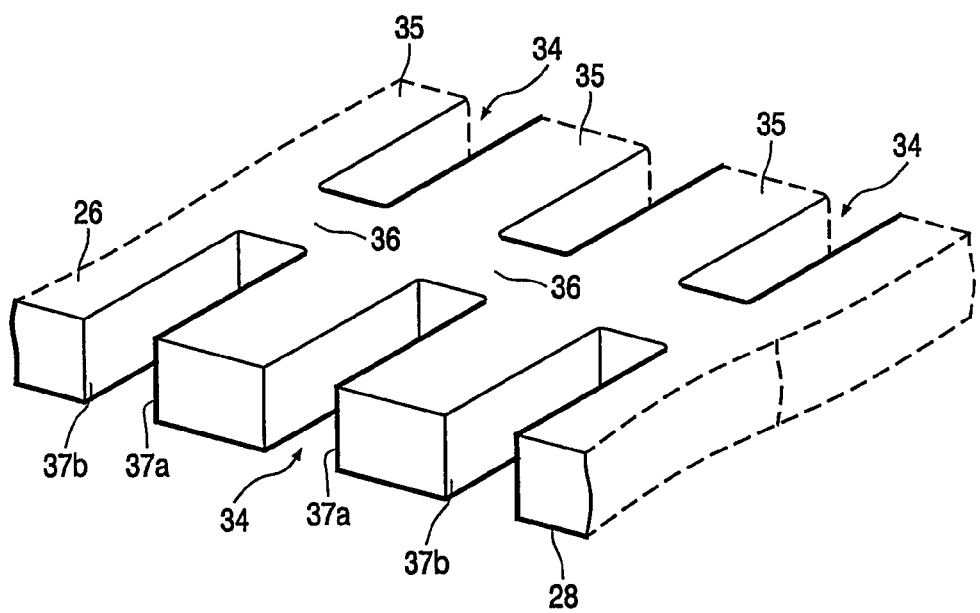
FIG. 4 shows the same substrate provided with slots.

To provide a number of components simultaneously with conducting wires on their side surfaces, or to provide an extended device with such wires on inner walls of slots or holes of its substrate, one starts from a substrate shape as shown in FIG. 3. FIG. 3 shows a substrate plate 24 having an upper major surface 26 and a lower major surface 28. Slots are made in this plate by means of, for example, a laser drilling and a powder blasting process. As shown in FIG. 4, this process creates a series of mutually parallel slots 34, which extend from the upper major surface 26 through to the lower major surface 28. These slots serve to subdivide the substrate 24 into segments 35 extending parallel to the slots 34 and located between consecutive pairs thereof. Each segment 35 has two oppositely located walls 37a, 37b extending along the edges of the adjacent slots 34. The plate 24 is kept intact by the presence of a series of connecting bridges 36, which join adjacent segments 35 at regular intervals along their lengths.

The process for forming slots in the substrate may also comprise the following steps:
 providing a substrate plate of the required material;
 coating a resist material or laminating a resist sheet onto the plate;
 exposing the resist layer according to the desired pattern of slots 34, segments 35 and bridges 36;
 developing the exposed resist layer and then postbaking;
 powder blasting, and stripping the remaining portions of the resist.

Figure 5A:
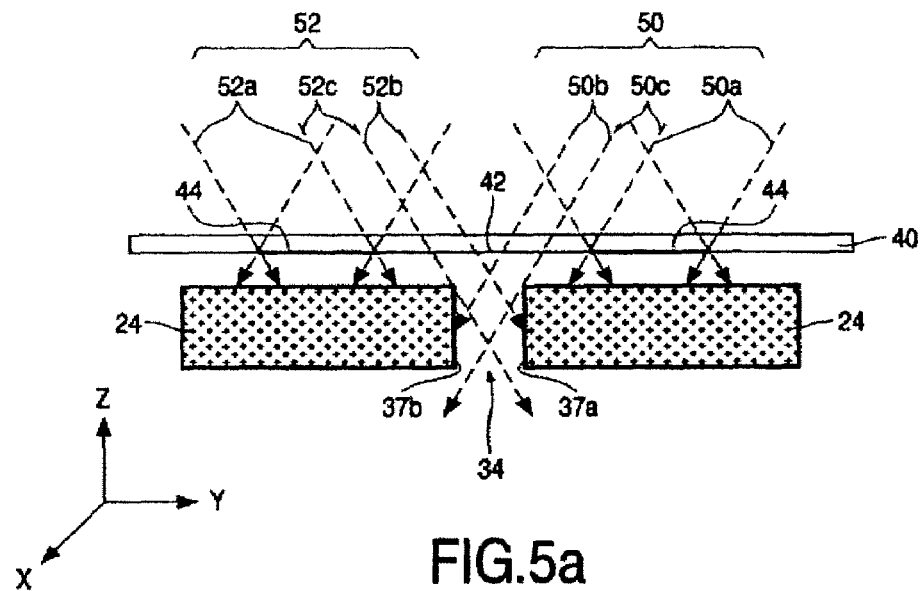
FIGS. 5a and 5b show a side view and a top view respectively, of a prior art exposure of the slotted substrate by means of skew beams.
Figure 5B:
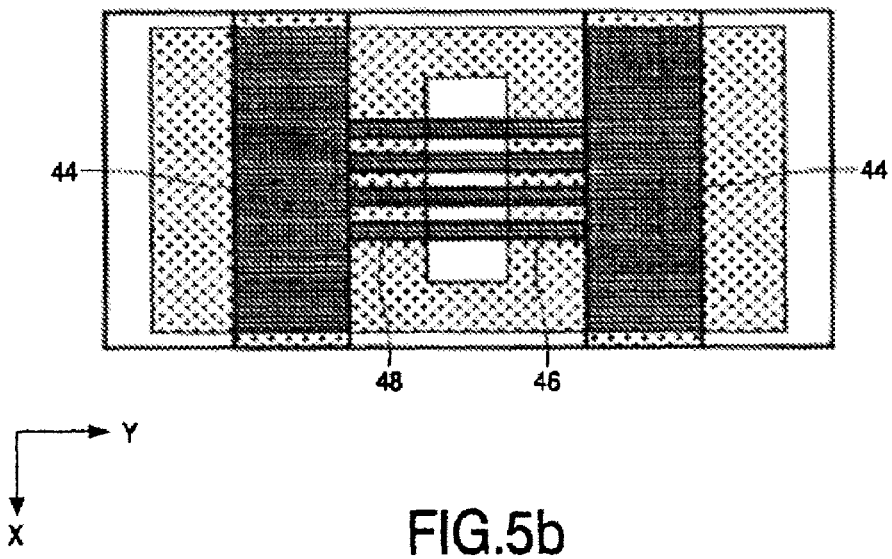

The slotted plate is then metalized and coated with an electrophoretic photo resist. To expose the resist on the walls of the slots, U.S. Pat. No. 6,240,621 proposes to use skew exposure in combination with a mask having transparent areas at the locations of the slots, as shown in FIGS. 5a and 5b. FIG. 5a shows a side view of the known exposure arrangement. Reference number 24 denotes a portion of the substrate provided with a slot 34. The mask is denoted by reference number 40 and comprises a radiation transmitting area 42 at the location of the slot 34. On both sides of the area 42 radiation blocking areas 44 are present. The area 42 may be divided into a number of radiation transmitting strips 46, which alternate with radiation blocking strips 48, as shown in the FIG. 5b top view of the relevant portion of the mask pattern. The number of radiation transmitting strips 46 is determined by the number of conducting wires to be configured on the walls, or surfaces, 37a, 37b.

For exposure of these surfaces two oppositely inclined beams 50 and 52 are used. These exposure beams may be supplied by two radiation sources at different positions and orientations or by the combination of a single source and means for splitting the beam from this source and for given the sub-beams the appropriate direction. Beam portions 50b and 52b are incident on the slot 34 such that they expose wall 37b and wall 37a, respectively, while beam portions 50a and 52a are blocked by the blocking areas 44 of the mask. The pattern of radiation transmitting strips 46 and radiation blocking strips 48 in mask area 42 divide beam portions 50b and 52b into a number of sub-beam portions corresponding to the number of radiation transmitting strips. These sub-beam portions have a strip-shaped cross-section. Each of the sub-beam portions exposes a strip of the resist layer on the substrate surfaces 37b and 37a respectively, so that later on a corresponding number of conducting wires or conducting strips are configured on these surfaces. The width of the conducting wires is dependent on the width of the sub-beam portions.

Beam portions 50c and 52c are incident on the slot neighboring areas of the resist layer on top of the substrate. These beam portions are also divided by the strip pattern in mask area 42 so that these beam portions expose a number of top resist strips corresponding to the number of exposed resist strips on the side surface. Each exposed top-resist strip joins another one of the exposed resist strips on the side surface.

By means of well-known lithographic steps of resist developing, baking, etching and stripping of remaining resist, the pattern of exposed and non-exposed resist strips is converted into a pattern of electrically conducting wires, or conducting tracks on the side surfaces and on the substrate top areas joining these surfaces.

Mask areas between the slots may comprise patterns of mask device features corresponding to device features, for example electrically conducting tracks or features of electronic or electro-optical components to be configured in substrate layer areas between the slots. A radiation blocking area 44 in the mask may form part of such a pattern of mask device features. Such mask device features may be imaged by the skew beam(s) used for exposing the slots in the substrate.

A consequence of the use of a skew exposure beam is that the performance of the exposure arrangement is sensitive to a variation of the gap width. If the gap width W changes, the exposure pattern, i.e. the radiation distribution in the plane of the upper surface of the resist layer, will shift and the width of the exposed strips will change. The degree of this sensitivity depends on the inclination angle of the exposure beam. The larger the inclination angles (the angle between the chief ray of the beam and the normal to the substrate) the higher the gap width sensitivity, as is shown in FIG. 6.

Figure 6:
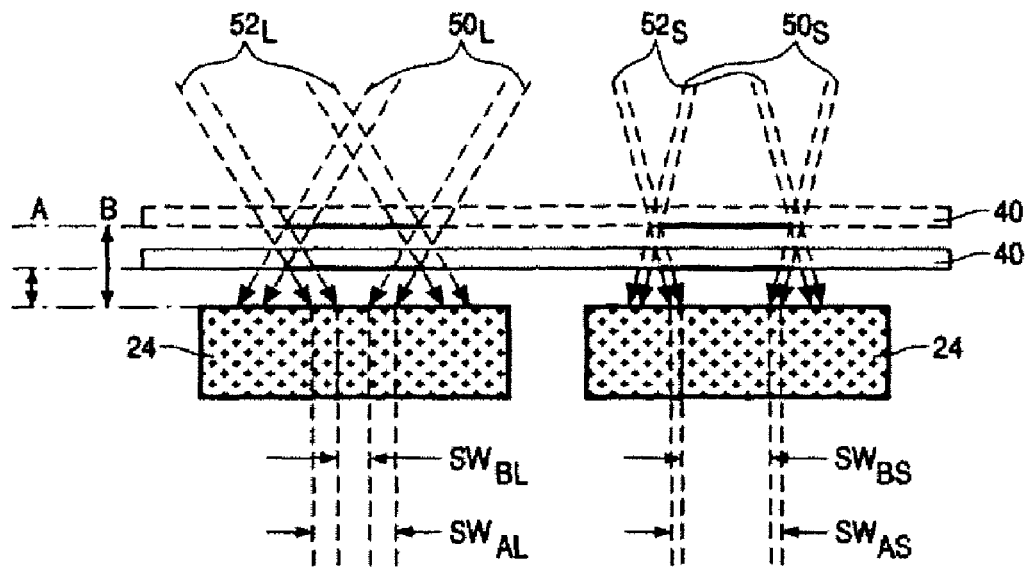
FIG. 6 shows the influence of the proximity gap width and the inclination of the exposure beam on the width of exposed strips.

FIG. 6 shows the exposed strip width SW for two gap widths A and B and for a relatively large (L) and a relatively small (S) inclination angle. For the larger gap width B a strip width $SW_{BL}$ for the larger inclination angle and a strip width $SW_{BS}$ for the smaller inclination angle are obtained. For the smaller gap width A, a strip width $SW_{AL}$ for the larger inclination angle and a strip width $SW_{AS}$ for the smaller inclination angle are obtained. The strip width will become smaller if the gap width becomes larger and this effect will be larger for a larger inclination angle than for a smaller inclination angle.

Moreover, the known exposure arrangement of FIGS. 5a and 5b can only be used to expose slot surfaces extending in the XY plane of FIG. 5a and not for exposing surfaces extending in the YZ plane. The skew exposure requires a special, non-conventional exposure apparatus.

According to the invention the required inclination of exposure beam portions, which should expose side surfaces is realized by a new type of mask. This mask comprises diffraction structures at positions corresponding to the positions of slots, grooves, holes or other kind of interruptions in the substrate wherein conductive strips or wires have to be configured. The diffraction structures perform a controlled deflection of exposure beam portions only at positions where skew exposure is required. Now a perpendicularly incident beam can be used to illuminate the mask so that the problems of shifting of the exposure pattern and variation of the exposed line width are eliminated. A specific exposure apparatus is no longer needed and the capabilities of a conventional exposure apparatus can be substantially enlarged. The diffraction structure can be designed such that it diffracts the exposure radiation in two mutually perpendicular directions so that end surfaces extending both in the XZ plane and in the YZ plane can be exposed. It is even possible to expose round vias in the substrate, which allows the manufacture of types of components, which could not be manufactured by conventional methods.

Figure 7:
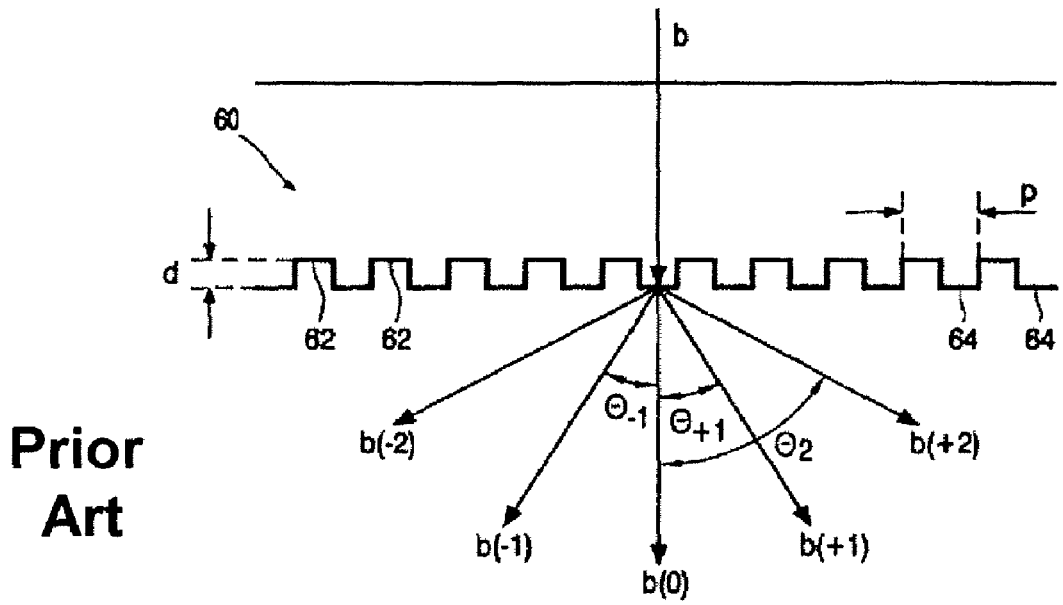
FIG. 7 shows the principle of a diffraction grating.

A linear grating, for example, a phase grating is one embodiment of the diffraction structure. FIG. 7 shows a portion of such a grating, which comprises grating strips 62 in the form of grooves etched in the mask substrate 60, for example of quartz, which grating strips alternate with intermediate strips 64. The grooves have a geometrical depth d and introduce a phase difference between portions of the incident beam b (the exposure beam) passing through the grooves and beam portions passing through the intermediate strips. The beam portions interfere with each other such that sub-beams having different directions (different diffraction orders) are created. This phenomenon is called diffraction and the different directions are called diffraction orders. FIG. 7 shows a zero-order, non-deflected sub-beam b(0), plus and minus first-order sub-beams b(+1) and b(−1), which are deflected at an angle $\theta_1$, and plus and minus second-order sub-beams b(+2) and b(−2), which are deflected at an angle $\theta_2$ ($\theta_2=2.\theta_1$).

For the envisaged application the intensity of the zero-order beam should be smallest possible, because this beam propagates straightforward through the substrate slots. Also the intensities of the second and higher-order beams should be smallest possible so that all the incident radiation is concentrated in the first-order beams. The degree in which this can be realized is called the grating efficiency. This efficiency is determined by the grating pitch p, the duty cycle, i.e. the ratio of the groove width and the pitch, and the optical depth of the groove. The optical depth is the product of the geometrical depth d and the refractive index n of the mask substrate material.

For exposure of the side surfaces in the substrate the deflection angle $\theta_1$ should be at least of the order of 20°, and thus the angle of incidence of the first-order beams at the side surfaces should be at most of the order of 70°. Exposure radiation incident at such an angle is sufficiently absorbed by the resist. For larger angles of incidence, i.e. deflection angles $\theta_1$ smaller than 20°, too much radiation will be reflected by the resist layer on the side surfaces and the exposure becomes unreliable. The grating pitch p and the wavelength $\lambda$ of the exposure radiation determine the deflection angle $\theta_1$ of the first diffraction order according to the following relation:

$$\sin(\theta_1)=\lambda/p$$

To obtain a first order deflection angle of 20° with a wavelength of 365 nm, the grating pitch should be 1067 nm.

To obtain a grating, which has maximum efficiency for the first orders the zero-order beam should be suppressed to the maximum; the intensity of the higher-order beams is already considerably smaller than those of the zero and the first-order beams. The zero order beam is completely cancelled if the following conditions are met:
 the phase depth of the grating, i.e. the phase difference between first-order radiation and zero-order radiation, is 180° and
 the duty cycle of the phase grating is 50%.

As the zero-order radiation is not absorbed or reflected and because of the law of energy conservation, this radiation is not lost but added to the first-order radiation. For a grating in air, having a refractive index equal to 1, the required phase depth of 180° is obtained for:

$$\lambda=2d.(n-1)$$

wherein n is the refractive index of the mask substrate material. If this material is quartz and the exposure radiation has a wavelength of 365 nm, the geometrical depth d is 397 nm. Currently available lithographic techniques allow the manufacture of phase gratings having such a depth and a pitch of 1067 nm, thus a grating strip width of 533 nm.

If the grating is embedded in a medium having a refractive index $n_1$, the required phase depth of 180° is obtained for:

$$\lambda=2d.(n-n_1)$$

Instead of a phase grating an amplitude grating may be used. An amplitude, or black and white, grating is a structure of alternating coplanar radiation blocking and transmission strips. The radiation blocking strips may be of chromium, which material is currently used in optical lithography. As to phase depth an amplitude grating behaves like a phase grating having a phase depth of 180°. As radiation transmitted by an amplitude grating has a zero-order component, such a grating is less efficient with respect to the first-order beams than a phase grating. An amplitude grating blocks half the incident radiation.

Figure 8:
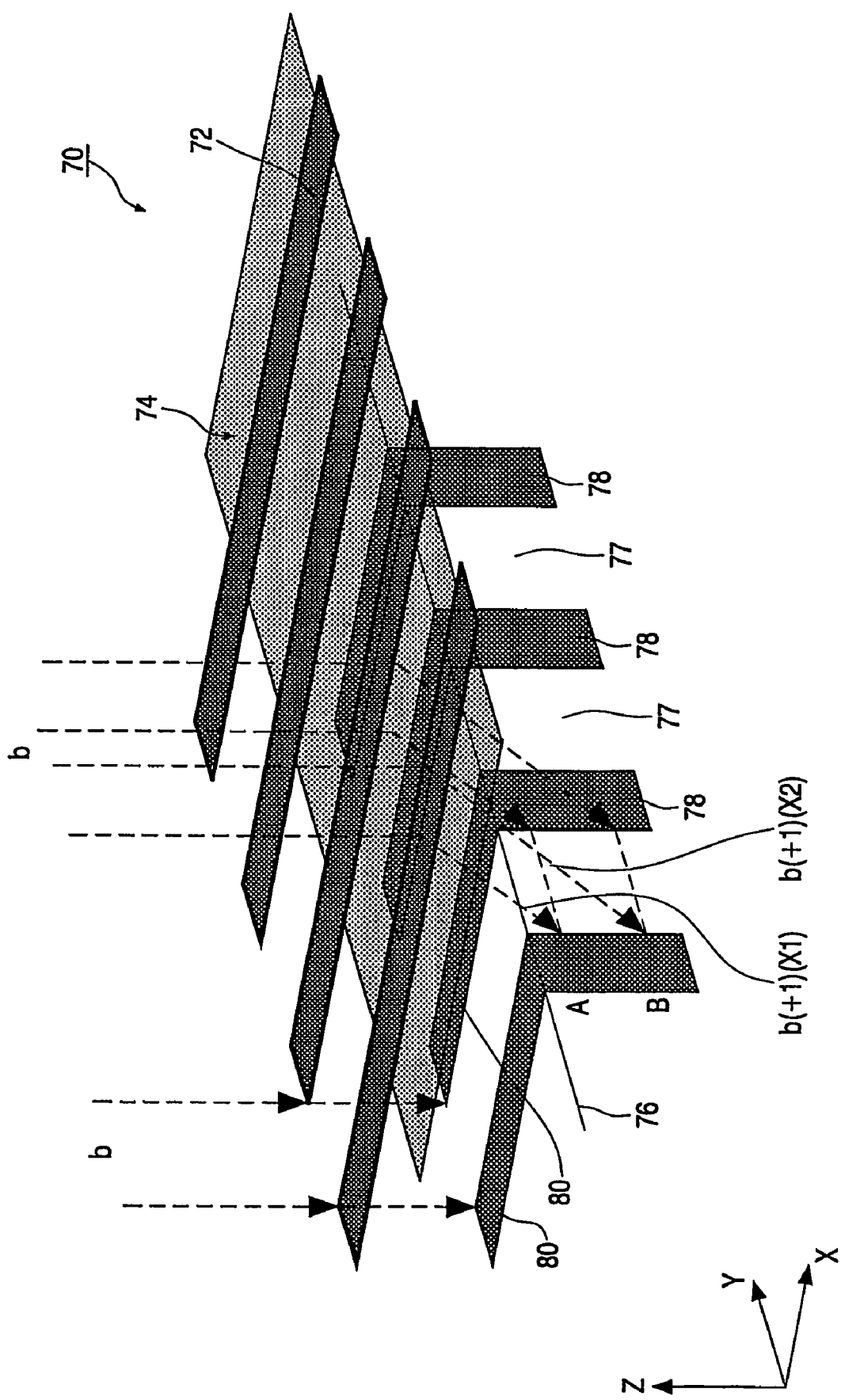
FIG. 8 shows the exposure of a substrate side surface by means of a mask structure comprising such a diffraction grating.

FIG. 8 shows, very schematically and for illustrative purpose, a 3-D exposure arrangement according to the invention for forming a wiring of conducting strips 80 on the top surface and a corresponding wiring of strips 78 on a side surface of a substrate. The substrate itself is now shown. Only the edge line 76 of the top surface and the relevant side surface and the exposed strips on the top surface and those on the side surface are shown. The mask structure 70 for realizing such an exposure comprises a series of radiation blocking strips 72 and a diffraction structure 74, which is arranged between these strips. The radiation blocking strips 72 are, for example chromium strips, which extend in the X direction. The sub-micron broad grating strips of the diffraction structure 74 extend in the Y direction. As is clear from FIG. 7, diffraction takes place in a plane, which is perpendicular to the direction of the grating strips. For the situation of FIG. 8 this means that exposure radiation incident on the diffraction structure is deflected in the XZ plane so that this radiation exposes the strips 78. The diffraction structure 74 may overlay in the X-direction the areas of exposed strips 80 on the top surface. The diffraction structure may also extend in the X direction over a length sufficient to expose the side surface strips 78.

In case the chromium strips 72 overlie strips 80 on the substrate top surface and strips 78 on the substrate side surface, the diffraction structure illuminates the intermediate strips 77 and for wiring forming the combination of a negative resist and a semi-additive process can be used. At the positions of strips 78 and 80 the resist layer will not receive radiation and at these positions resist material will be removed during resist development. In the next electrochemical process step metal is grown in the thus obtained slots in the resist layer.

Between the mask pattern and the substrate a small gap having a width of the order of 100 μm is maintained to avoid contamination of the substrate and damage of the substrate and the mask. The distance between the mask pattern plane and the resist layer on top of the substrate surface that is to be configured determines, together with the wavelength of the exposure beam and the degree in which this beam is collimated, the resolution of the pattern of exposed strips. The resolution of an imaging system, which the exposure system is, is understood to mean the number of strips per unit of length, in the Y-direction of FIG. 8, that can be imaged separately, thus sufficiently separated from each other. The smaller the distance between the mask pattern and the resist layer, the higher the resolution that can be obtained. The higher the resolution, the smaller the minimum strips width that can be imaged.

For a side surface of the substrate said distance between the mask pattern plane and the resist layer is not only determined by the gap between the substrate top surface and the mask pattern plane, i.e. the proximity gap, but this distance is also dependent on the X-position on the mask pattern. In the arrangement of FIG. 8 exposure rays b(+1)x$_1$, b(+1)x$_2$ incident on the side surface at height A and height B, respectively originate from different X positions on the mask pattern so that for these the distance between the mask and the side surface is different. This difference increases with increasing proximity gap width. Increasing the proximity gap width results in an increase of said difference and in a decrease of the modulation depth. The modulation depth m is defined as:

$$M=(I_{max}-I_{min})/(I_{max}+I_{min})$$

Wherein $I_{max}$ and $I_{min}$ is the maximum and minimum intensity, respectively in the exposure pattern in the resist layer. However, for an embodiment of the method for forming strips and intermediate strips having a width as small as 50 micron and using an exposure beam having a wavelength of 365 nm and a collimation angle of 2°, the modulation remains 100% for proximity gap width up to 600 μm. Only for a gap width larger than 600 μm the modulation depth starts to decrease. This means that the new method shows a large tolerance for gap width variations and allows to use a conventional proximity printing apparatus for three-dimensional lithography thereby obtaining even better results than with a proximity printing apparatus specially designed for three-dimensional lithography. The invention thus creates a novel application of the conventional apparatus and substantially enlarges the capabilities of such an apparatus.

The maximum gap width of 600 μm is coupled to strip width of 50 μm. If conducting strips broader than 50 μm have to be formed, the maximum proximity gap width is larger than 600 μm.

The collimation angle is a measure for the degree in which the exposure beam is a collimated beam. This angle is defined as the angle between the chief ray of the beam and the border ray. Essential for the present method is that the exposure beam is substantially a collimated beam. The best results are obtained if the exposure beam is a fully collimated beam, i.e. a beam having a collimation angle of 0°. However, also with an exposure beam having a collimation angle of the order of 2° a very good result is obtained. The exposure beam may be supplied by a mercury arc lamp, which is currently used on proximity lithography and which supplies inter alia radiation with the above-mentioned wavelength of 365 μm. This radiation can be collimated to 2° without losing too much energy. Instead of a lamp also a laser can be used. Lasers provide the advantage that they supply a beam, which is collimated to the required degree.

The illumination step is followed by a resist develop step whereby exposed resist portions are removed in case a positive resist is used or non-exposed resist portions are removed in case a negative resist is used. The remaining resist structure is used as an etch mask, whereby material of the underlying metal layer is removed at the positions where the resist material has been removed. The required conducting strips are obtained by stripping the remaining resist. This process is called a subtractive process. Also an additive process can be used. Thereby conductive material, for example metal, is grown on positions where resist material has been removed during the developing step.

Figure 9A:
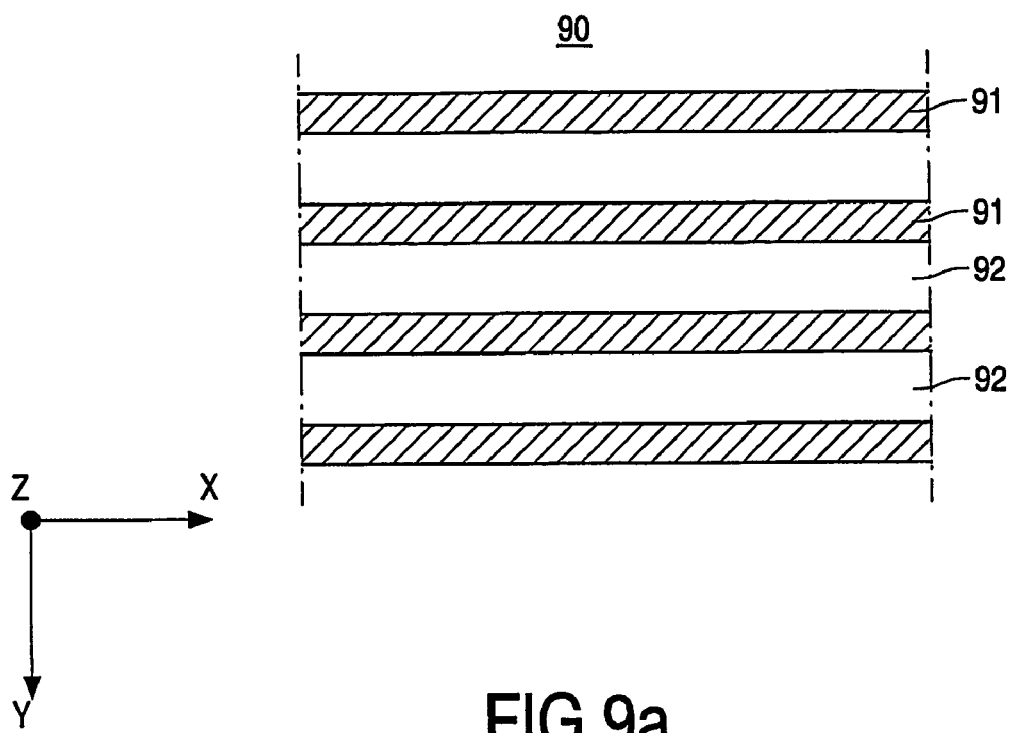
FIGS. 9a-9d show different embodiments of the diffraction structure by means of which the novel method can be carried out.
Figure 9B:
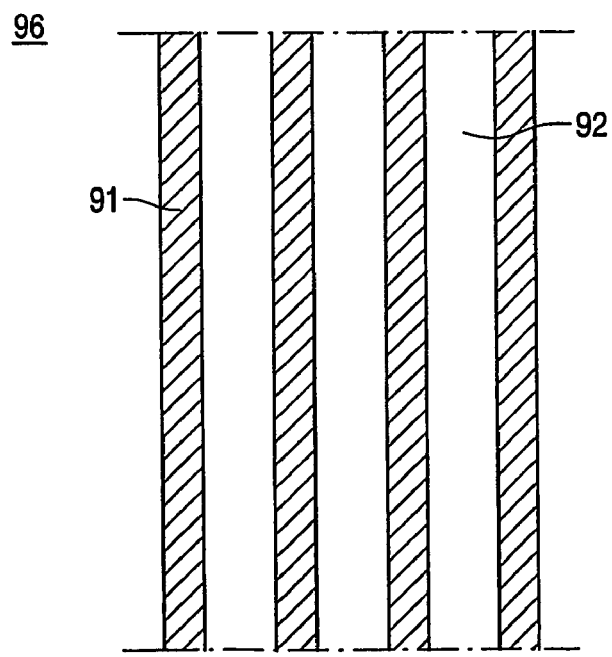

The diffraction structure embedded in the mask pattern described above is a linear, grating, structure 90, which grating strips may extend in an X direction as shown in FIG. 9a to deflect exposure radiation in the YX plane. In this Figure, and in the following Figures, reference numeral 91 and 92 denotes the grating strips and the intermediate strips, respectively. The linear diffraction structure may also be a structure 96 as shown in FIG. 9b having the grating strips and intermediate strips extending in the Y direction to deflect radiation in the XZ plane. The linear diffraction structure may have any orientation between 0.degree. and 360° in the XY plane. The diffraction structure may also be a two-dimensional structure, which allows deflection of radiation both in the YZ plane and in the XZ plane.

Figure 9C:
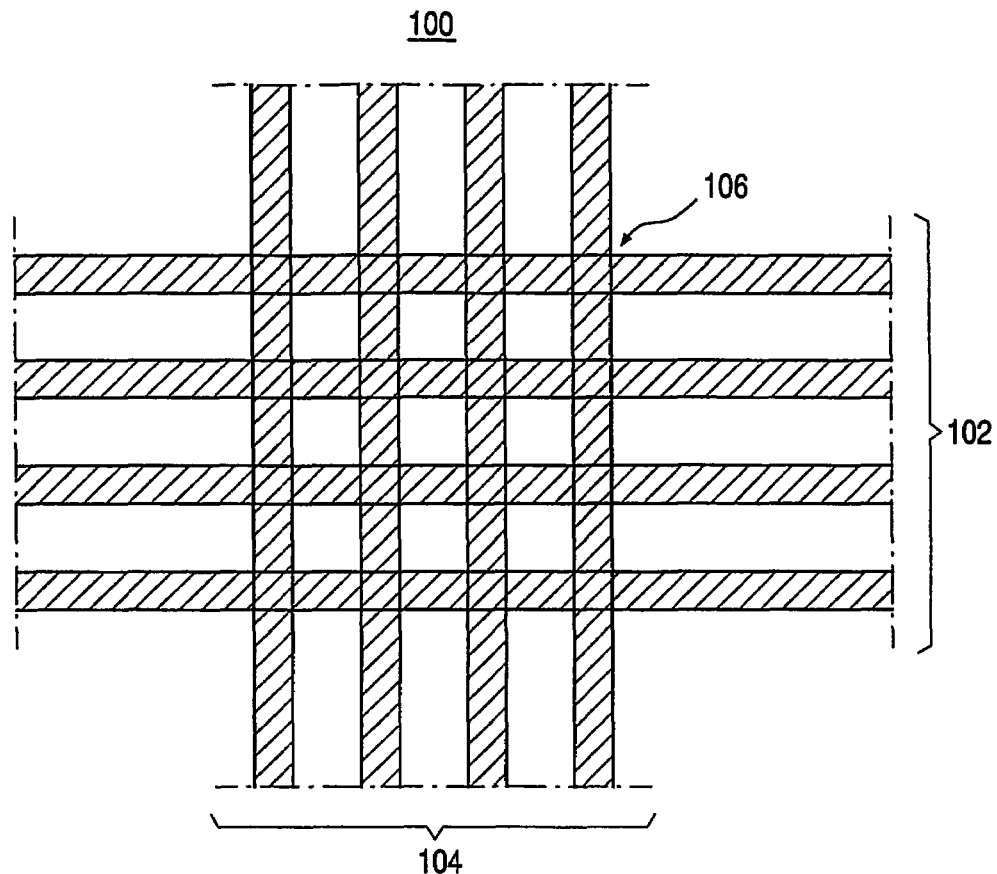

FIG. 9c shows an embodiment 100 of the diffraction structure composed of a linear grating 102, which diffracts in the Y direction, and a linear grating 104, which diffracts in the X direction. Such a grating structure can be used to form a conducting strip on each inner surface of a square hole or four strips, i.e. two pairs of opposed strips on the inner surface of a round hole. In the centre of the composed diffraction structure, where the two gratings intersect each other, a chessboard grating 106 is obtained. This chessboard grating diffracts the incident radiation in four directions, i.e. the radiation is divided in two first-order sub-beams in the Y direction and two first-order beams in the X direction. To compensate for the reduced intensity of the four sub-beams the illumination dose can be increased.

Figure 9D:
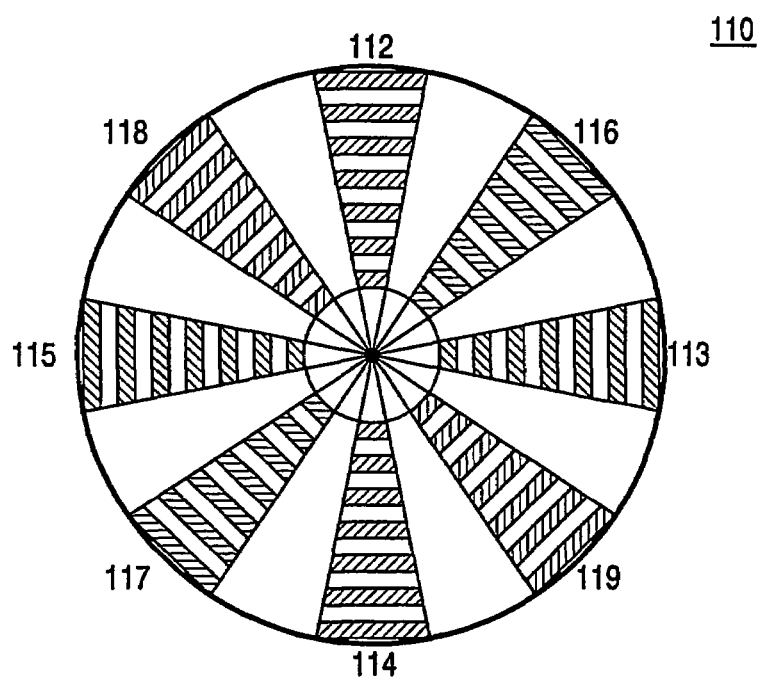

FIG. 9d shows an embodiment 110 of the diffraction structure comprising a number of linear gratings 112-119, which are arranged in a circle. This embodiment can be used to form a number of conducting strips on the inner side of a round via or slot in a substrate. In FIG. 9d eight gratings are shown, but the number of gratings may be substantially larger, for example twenty, and is determined by the required number of conducting strips.

Diffraction structures have the advantages that their design can easily be adapted to the envisaged function, i.e. to the required exposure pattern. If needed, a correction term, for example a lens function, may be built-in in the diffraction structure. The diffraction structure then shows small deviations from the regular linear structure.

Figure 10A:
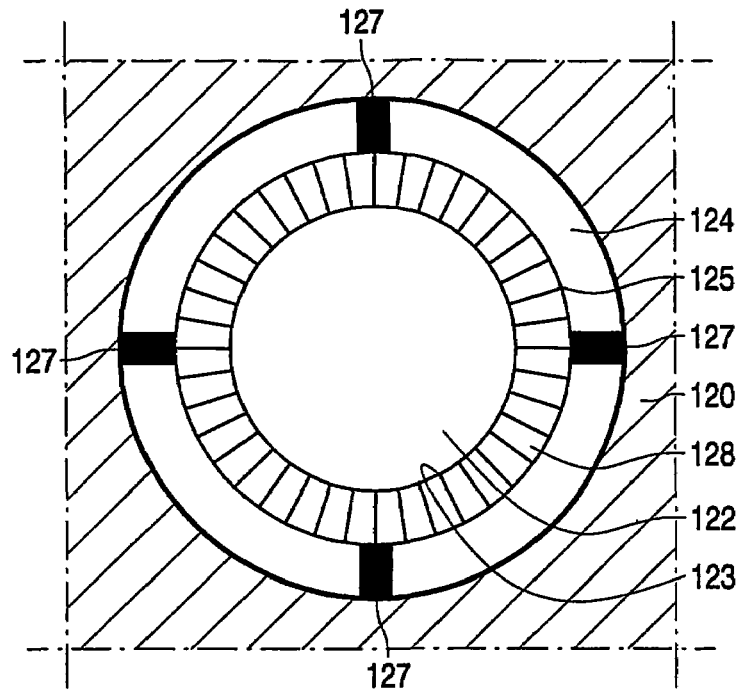
FIG. 10a shows a first diffraction structure by means of which an induction coil can be manufactured.

FIG. 10a shows, by way of example, how an induction coil can be configured in a substrate by means of the circular diffraction structure 110. This Figure shows a top view of a substrate portion wherein the coil has to be configured. The substrate surface is denoted by reference numeral 120. First a circular slot or via 122 and an annular slot 124 are formed whereby the annular cylinder 128 of substrate material remains connected to the substrate. Then the inner and outer surfaces 123 and 125 and the upper and lower surfaces of cylinder 128 are coated with an electrically conducting layer, for example a metal, layer. This layer is coated by a resist layer. The resist layers are exposed via a mask having the diffraction structure 110, so that strip-shaped areas of the resist layers are exposed. After resist developing, etching and resist stripping, a pattern of conducting wires or strips as shown in FIG. 10b is obtained.

Figure 10B:
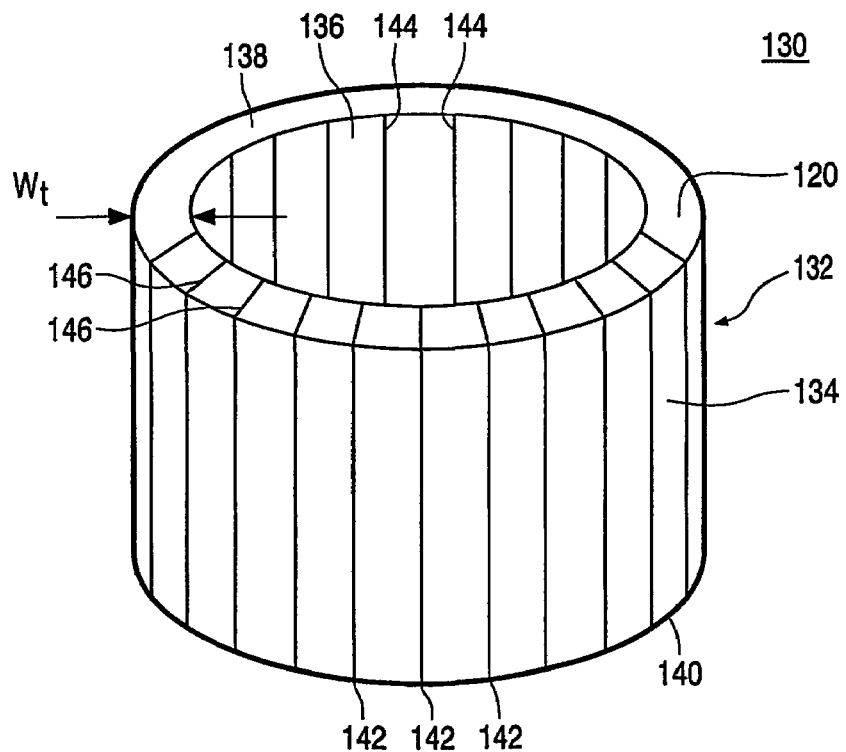

The coil 130 is represented in FIG. 10b as isolated from the original substrate for clarity sake. It comprises a cylinder 132 of substrate material 120, for example ceramic or ferrite having a wall thickness wt. The outer surface 134 and the inner surface 136 of the cylinder are provided with conducting wires 142 and 144, respectively. Also the upper surface 138 and the lower surface 140 are provided with conducting wires 146, which connect wires 142 to wires 144.

For this specific component the resist-covered substrate both the upper surface and the lower surface are exposed. A number of coils can be manufactured simultaneously in one substrate after which the substrate can be sliced to obtain individual coils.

Figure 11:
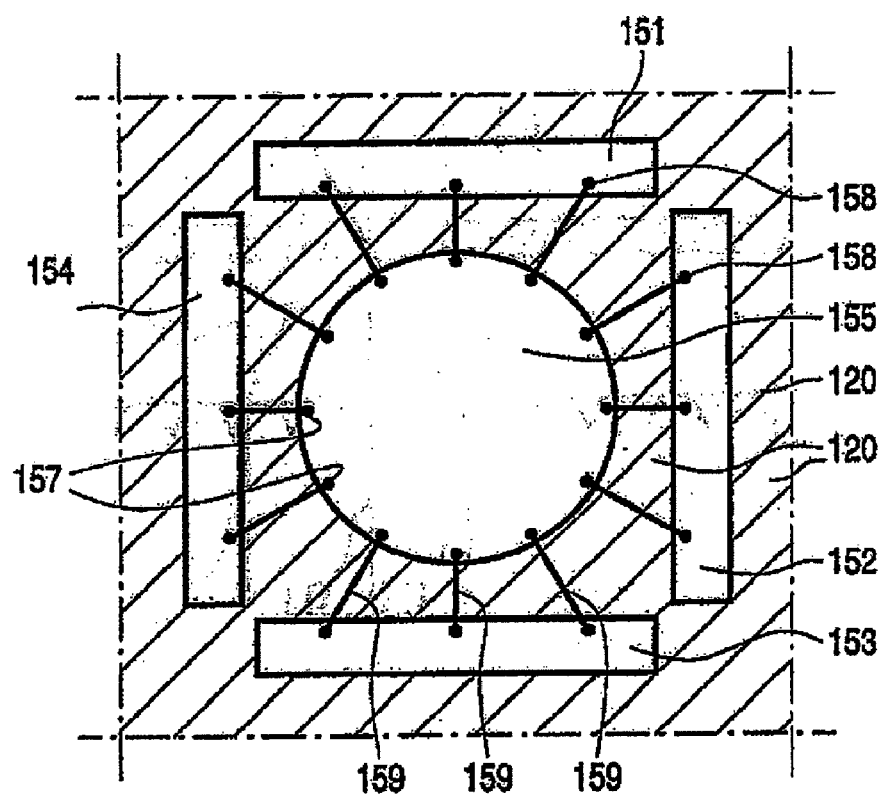
FIG. 11 shows a second diffraction structure by means of which the induction coil of 10b can be manufactured.

For the coil of FIG. 10b the pattern of conducting wires has the same pitch at the upper and lower surface. The novel method can also be used to manufacture a component having on its upper surface a finer wiring pitch than on its lower surface. FIG. 11 shows such a component 150, which comprises a circular hole 155 in a substrate 120, which hole is surrounded by four rectangular slots 151-154. The inside of the hole is provided with a pattern of conducting strips 157, which join conducting strips 159 at the upper side. Strips 159 spread out to the slots 151-154 to join conducting strips 158 on the insides of these slots 151-154. The pitch of the strips 158, which lead to the lower side of the substrate have a larger pitch than the strips 157.

Figure 12:
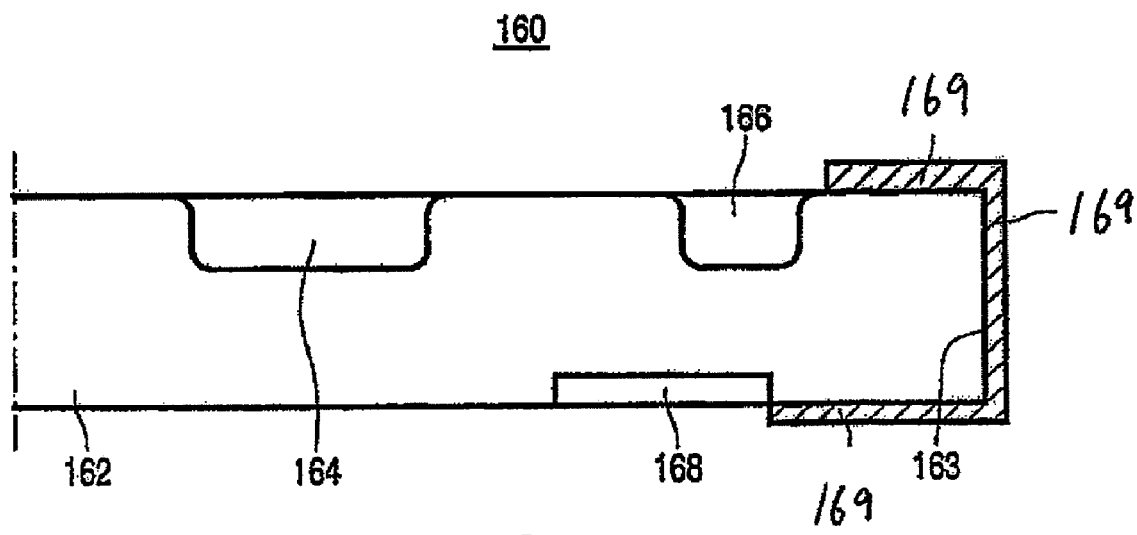
FIG. 12 shows a transistor, which can be manufactured by means of the novel method.

Another component during the manufacture of which the invention can be used is a field effect transistor (FET) 160 such as the power transistor described in U.S. Pat. No. 6,420,755, which is schematically shown in FIG. 12. This transistor comprises a substrate 162, for example of silicon, which upper surface is provided with a source region 164 and a gate region 166, the material of which is different from the substrate. The lower surface is provided with a drain region 168, which should be connected to the upper surface by means of an electrically conducting wire or strip 169 on side surface 163 of the substrate. One step in the manufacture of this transistor consists of exposing the resist-covered side surface by means of a mask, which comprises a diffraction grating at the position of the side surface.

The induction coil of FIG. 10b, which may have a high inductance, and the transistor of FIG. 12 are only two examples of a passive component that can be manufactured by means of the novel method. Other types of components for the manufacture of which the invention can be used are a miniature power transformer and antenna. The power transformer comprises an induction coil and a number of windings. The antenna comprises a small block of ceramic material and a metallic pattern on two opposite surfaces, which patterns are connected by means of wiring pattern on the other surfaces.

Figure 13:
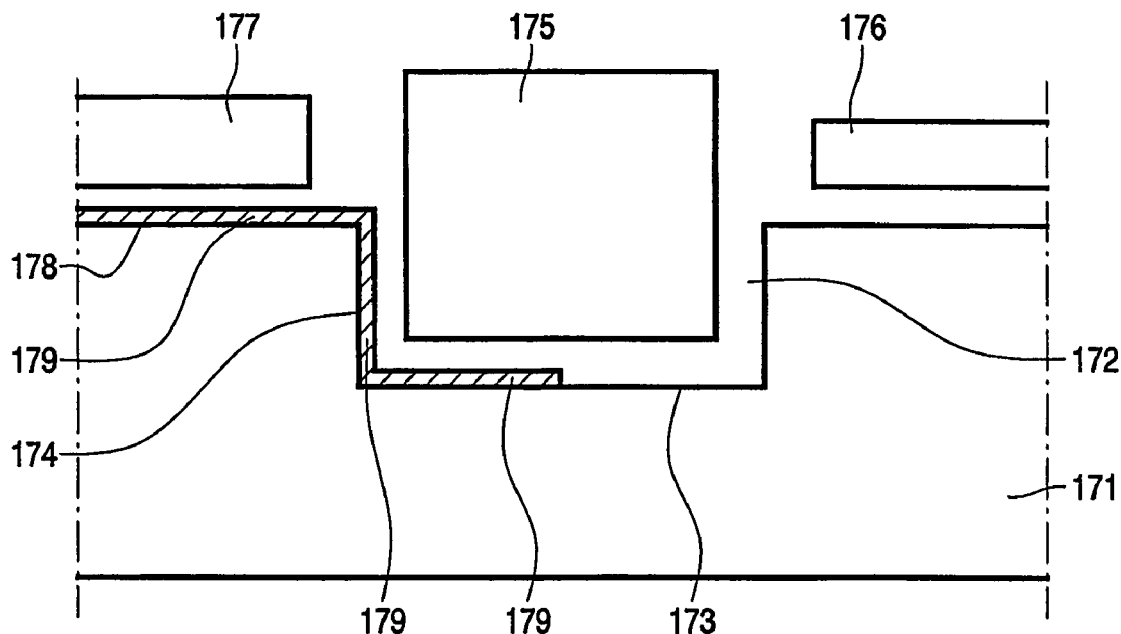
FIG. 13 shows how the novel method can be used in packaging of a diode laser.

The invention can also be used in the manufacture of micro systems composed of elements of different types, such as a micro-optical-electrical-mechanical system (MOEMS) or a micro-electrical-mechanical system (MEMS). FIG. 13 shows such a system, or device, 170 comprising a diode laser 175, a light guide or fiber 176 at the front of the laser and a detector 177 at the back of the laser. This device system, also called laser package, may be used in optical telecommunication systems. The detector 177 is connected to an electric circuit (not shown), which may be used, for example, to control the intensity of the laser beam emitted by the laser. To this end the laser should be connected to the control circuit by means of electric wiring, schematically represented by a wire 179. This wire extend across the surface 173 of the sunken area 172 of the substrate wherein the diode laser is placed, the side surface of area 172 and the substrate upper surface 178. One step in the process for providing the substrate with the wiring 179 consists of exposing the resist-coated substrate surface by means of a mask comprising a diffraction structure at the location of the surfaces 173, 174 and 178.

The method of the invention is especially suitable to provide a number of components on one side of a substrate with connections to a common layer or electrode structure or the opposite side of the substrate. For the different connections a common hole can be used. As a via for making such a connection requires space in the substrate and is relatively costly to make, use of one hole for several components, for example four transistors, provides advantages with respect space and costs.

Figure 14:
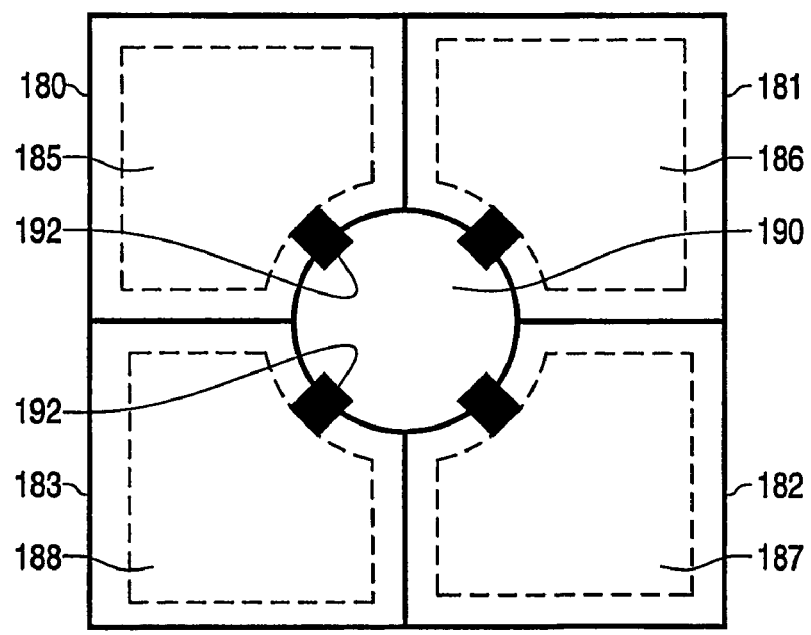
FIG. 14 shows how the novel method can be used to electrically connect electronic devices to a base plate.

FIG. 14 shows four substrate areas 180-183 carrying transistor structures, which are schematically represented by the interrupted contour 185-188. To connect the transistors to an underlying base, the substrate is provided with a central opening 190 on the inner surface of which at least one conducting wire, or conducting strip 192, for each transistor is to be formed. The required strips can be formed simultaneously by means of the novel method wherein use is made of a mask having a two-dimensional diffraction structure. Another advantage of the common hole of FIG. 14 is that the corresponding curvature in each component can be used as a reference when placing the component on a printed circuit board (PCB).

In the foregoing it has been demonstrated that the invention can be used to form an electrical wiring by means of illuminating a resist layer and etching an underlying conductive layer (subtractive process) or growing conductive materials at positions of openings in the resist layer after developing the resist. The invention can also be used to form a connection pattern by means of a process of removing portions of an isolating layer on top of a conductive layer without attacking the latter layer, for which process a depth (three-dimensional) illumination is required.

The novel method may also be used to connect a component configured in an upper substrate with a component in a lower substrate and in the manufacture of a device comprising a number of components or modules comprising a number of ICs.

Also for packaging of an individual component (chip scale packaging), i.e. accommodating the component in a protective housing, whereby electrical contacts between the component and the outside world should be provided, the novel method can be used to make electrically conducting strips for these contacts. This also holds for packaging of devices comprising a number of components (wafer scale packaging)

In general the invention can be used in manufacturing any device that has electrical wiring on at least one side surface. The term device should be interpreted broadly. It includes both a single, passive or active component, a module comprising a number of components, a number of such components or modules integrated in one substrate (multi-chip modules) and a wired carrier, for example a printed circuit board, for receiving a number of components or modules.

The invention claimed is:

1. A mask having a mask pattern which comprises at least one diffraction structure for deflecting incident radiation in a plane comprising a direction of periodicity of the diffraction structure and a propagation direction of the incident radiation, wherein the at least one diffraction structure includes a first structure having strips of a first pitch which is configured to deflect the incident radiation so that a deflected radiation is substantially concentrated in first order beams for simultaneously exposing surfaces in different planes of a substrate.

2. The mask of claim 1, wherein the diffraction structure is an amplitude structure.

3. The mask of claim 1, wherein the diffraction structure is a phase structure.

4. The mask of claim 3, wherein the phase structure has a duty cycle of 50% and a phase depth of 180°.

5. The mask of claim 1, wherein the diffraction structure is designed to deflect incident exposure radiation at an angle of substantially 20° to the normal to the grating surface.

6. The mask of claim 1, wherein the mask pattern comprises, next to a diffraction structure, mask features corresponding to substrate features to be configured in a substrate upper surface layer.

7. The mask of claim 1, layer the diffraction structure is a linear diffraction grating.

8. The mask of claim 1, layer the diffraction structure is a two-dimensional diffraction grating.

9. The mask of claim 1, layer the diffraction structure comprises a number of linear diffraction gratings, which each form a segment of a common circular area.

10. The mask of claim 1, wherein the at least one diffraction structure includes a second structure having strips of a second pitch which is different from the first pitch.

11. The mask of claim 1, wherein the different planes include two parallel planes.

12. The mask of claim 1, wherein the different planes are mutually perpendicular.

13. The mask of claim 1, wherein the at least one diffraction structure is configured to diffract the incident radiation in two mutually perpendicular directions so that end surfaces of the substrate extending both in an XZ plane and in a YZ are exposed, when the incident radiation is in an XY plane.

14. The mask of claim 1, wherein the first strips have a pitch, a duty cycle and an optical depth which are configured to form the first-order beams with higher intensity than intensities of zero-order and second-order beams.

15. A mask having a mask pattern which comprises at least one diffraction structure for deflecting incident radiation in a plane comprising a direction of periodicity of the diffraction structure and a propagation direction of the incident radiation, the diffraction structure corresponding to a substrate feature to be configured in a substrate side surface layer, wherein the at least one diffraction structure includes a first structure which is configured to deflect the incident radiation so that a deflected radiation is substantially concentrated in first order beams for simultaneously exposing surfaces in different planes of a substrate.

16. The mask of claim 15, wherein the at least one diffraction structure includes a second structure having strips of a second pitch which is different from the first pitch.

17. The mask of claim 15, wherein the different planes include two parallel planes.

18. The mask of claim 15, wherein the different planes are mutually perpendicular.

19. The mask of claim 15, wherein the at least one diffraction structure is configured to diffract the incident radiation in two mutually perpendicular directions so that end surfaces of the substrate extending both in an XZ plane and in a YZ are exposed, when the incident radiation is in an XY plane.

20. The mask of claim 15, wherein the first strips have a pitch, a duty cycle and an optical depth which are configured to form the first-order beams with higher intensity than intensities of zero-order and second-order beams.

* * * * *